(12) United States Patent
Kameno et al.

(10) Patent No.: US 9,072,195 B2
(45) Date of Patent: Jun. 30, 2015

(54) NETWORK COMMUNICATION DEVICE

(71) Applicant: ALAXALA Networks Corporation, Kawasaki, Kanagawa (JP)

(72) Inventors: Shuuji Kameno, Hadano (JP); Tooru Sasaki, Yokohama (JP); Manabu Sawa, Hadano (JP); Satoshi Shimada, Ebina (JP)

(73) Assignee: Alaxala Networks Corporation, Kanagawa (JP)

( * ) Notice: Subject to any disclaimer, the term of this patent is extended or adjusted under 35 U.S.C. 154(b) by 276 days.

(21) Appl. No.: 13/786,985

(22) Filed: Mar. 6, 2013

(65) Prior Publication Data

US 2013/0329364 A1    Dec. 12, 2013

(30) Foreign Application Priority Data

Jun. 8, 2012 (JP) ................................ 2012-131275

(51) Int. Cl.
*H05K 7/20* (2006.01)
*G06F 1/20* (2006.01)

(52) U.S. Cl.
CPC ........ *H05K 7/20136* (2013.01); *H05K 7/20563* (2013.01); *H05K 7/20572* (2013.01); *H05K 7/20154* (2013.01)

(58) Field of Classification Search
CPC ....... H05K 7/20; H05K 9/00; H05K 7/20563; H05K 7/20727; H05K 7/20572; G06F 1/20; G06F 1/184; G06F 1/16; G08B 17/10; G08B 21/18
USPC ........................ 361/679.46–679.52, 688–697, 361/715–721, 732, 754; 165/80.2, 104.33, 165/185, 121–126; 312/223.2, 223.3, 236; 174/16.3, 50.52, 520; 454/184
See application file for complete search history.

(56) References Cited

U.S. PATENT DOCUMENTS

| | | | | |
|---|---|---|---|---|
| 5,912,801 | A * | 6/1999 | Roy et al. ...................... | 361/690 |
| 6,768,640 | B2 * | 7/2004 | Doblar et al. ................. | 361/695 |
| 7,050,301 | B2 * | 5/2006 | Wong et al. ................... | 361/695 |
| 7,164,581 | B2 * | 1/2007 | Carullo et al. ........... | 361/679.48 |
| 7,262,962 | B1 * | 8/2007 | McLeod et al. .......... | 361/679.48 |
| 7,280,356 | B2 * | 10/2007 | Pfahnl et al. .................. | 361/695 |
| 7,344,439 | B2 * | 3/2008 | Henry et al. .................. | 454/184 |
| 7,722,359 | B1 * | 5/2010 | Frangioso et al. ............. | 439/61 |
| 7,804,684 | B1 * | 9/2010 | Aybay et al. ............... | 361/679.5 |
| 7,839,624 | B2 * | 11/2010 | Lin .......................... | 361/679.02 |
| 8,064,200 | B1 * | 11/2011 | West et al. .................... | 361/695 |
| 8,238,094 | B1 * | 8/2012 | Aybay et al. ............... | 361/679.5 |
| 8,908,372 | B1 * | 12/2014 | West et al. .................... | 361/695 |

FOREIGN PATENT DOCUMENTS

| | | |
|---|---|---|
| JP | 2011-146450 A | 7/2011 |
| WO | 2010/064299 A1 | 6/2010 |
| WO | 2012/066732 A1 | 5/2012 |

* cited by examiner

*Primary Examiner* — Michail V Datskovskiy
(74) *Attorney, Agent, or Firm* — Volpe and Koenig, P.C.

(57) ABSTRACT

A simple configuration for cooling comprises a front-back air supply and exhaust system. A first circuit board is located in front of a relay circuit board. A cooling unit and a second circuit board are placed behind the relay circuit board in a chassis. A first air passage allows intake air through an intake hole in a front side of the first circuit board unit to pass through the first circuit board and then through an opening in the relay circuit board to the cooling unit. A second air passage allows intake air through an intake hole in a front face of the chassis to pass through a lateral side of the first circuit board and then through a vent hole in a partition provided at the lateral side of the first circuit board. The second circuit board is placed in the second air passage.

15 Claims, 10 Drawing Sheets

FIG.1
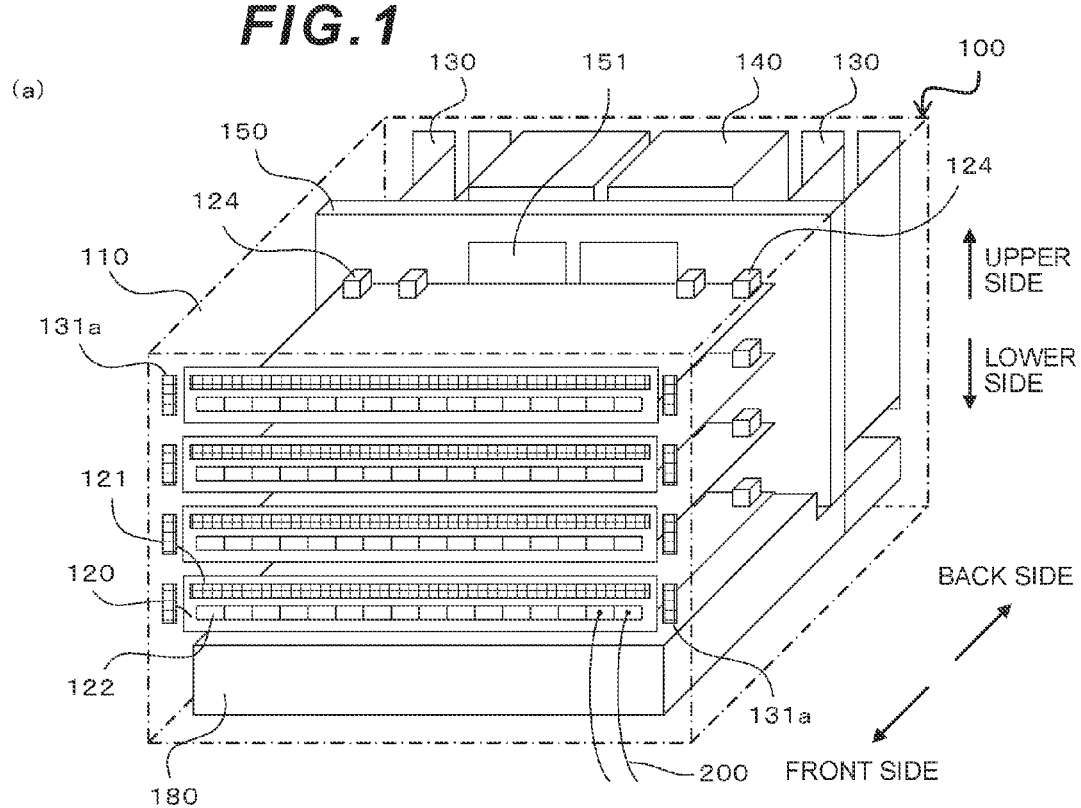
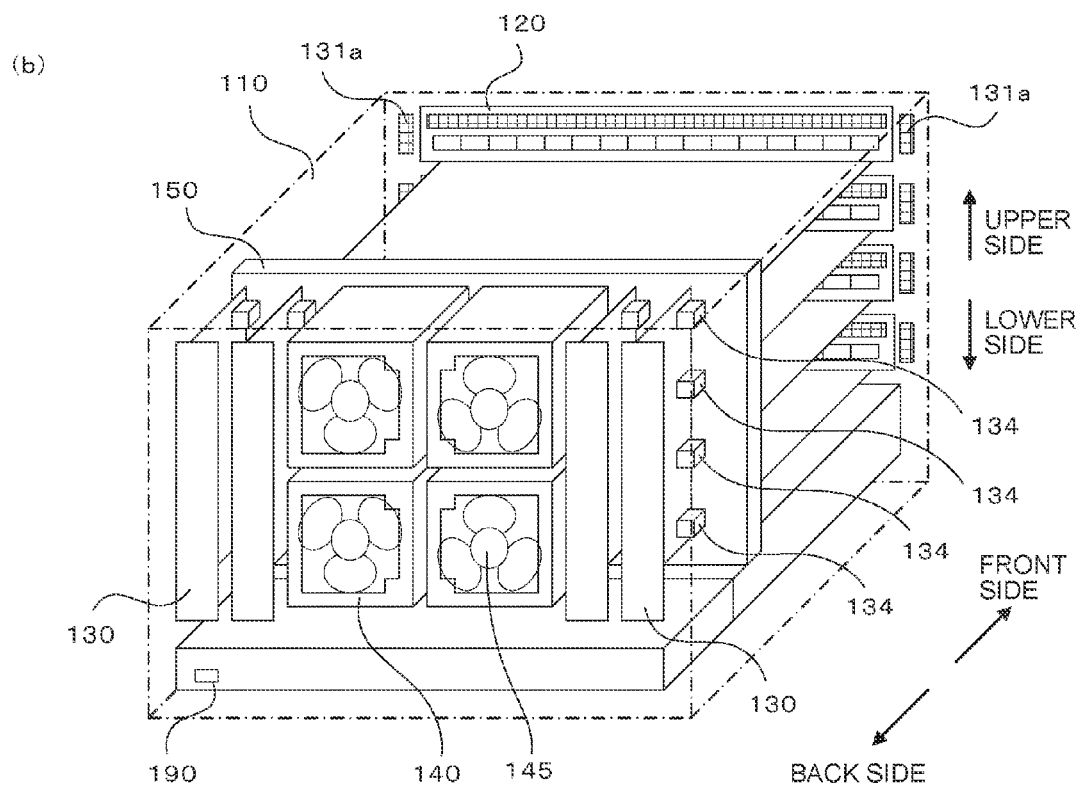

*FIG.5*
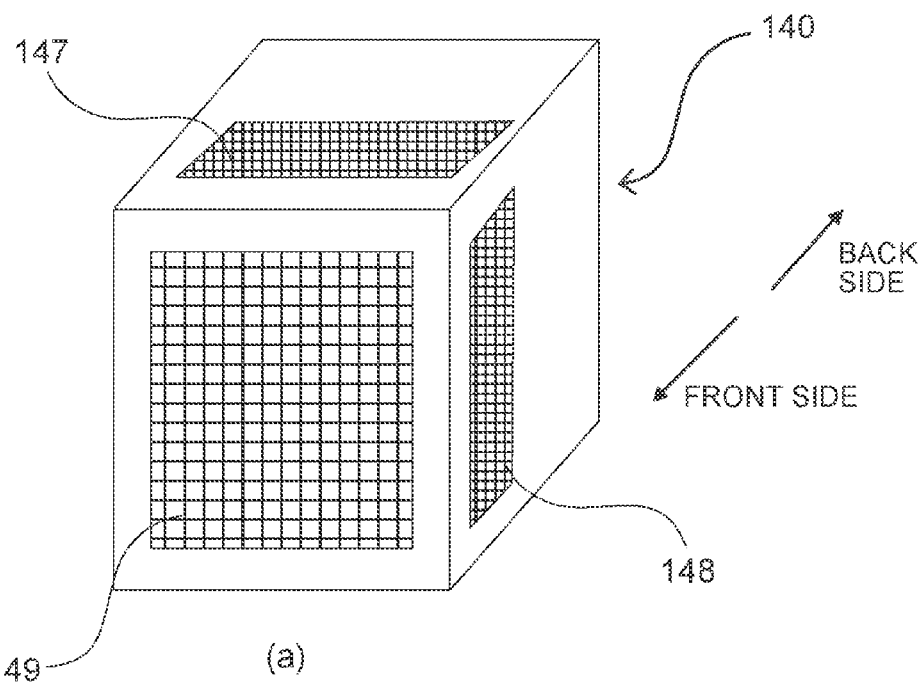
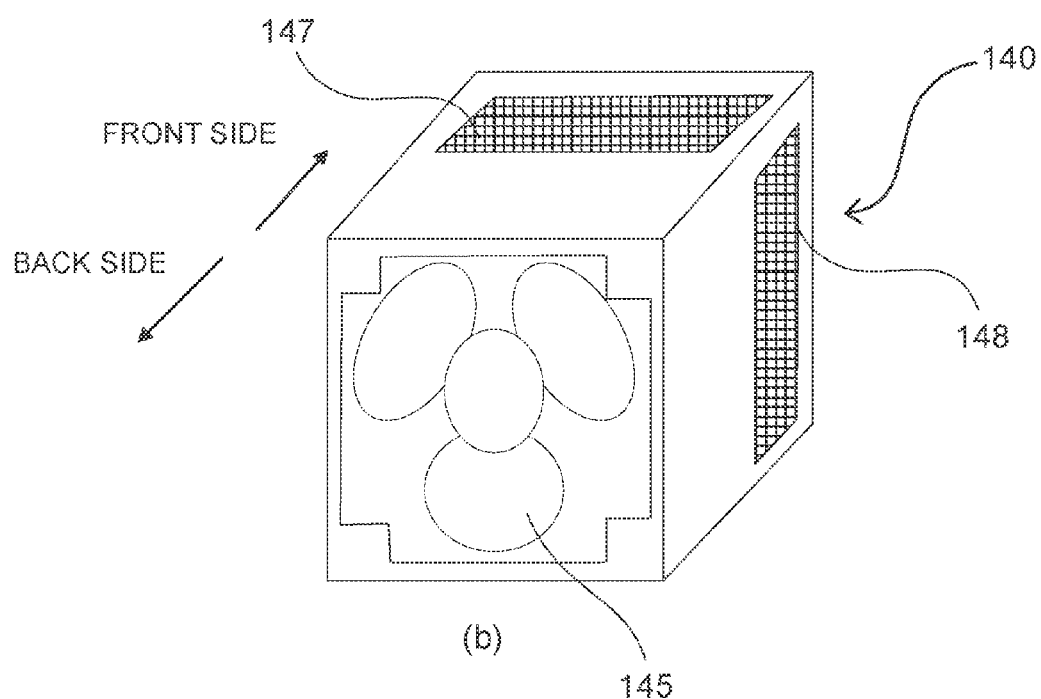

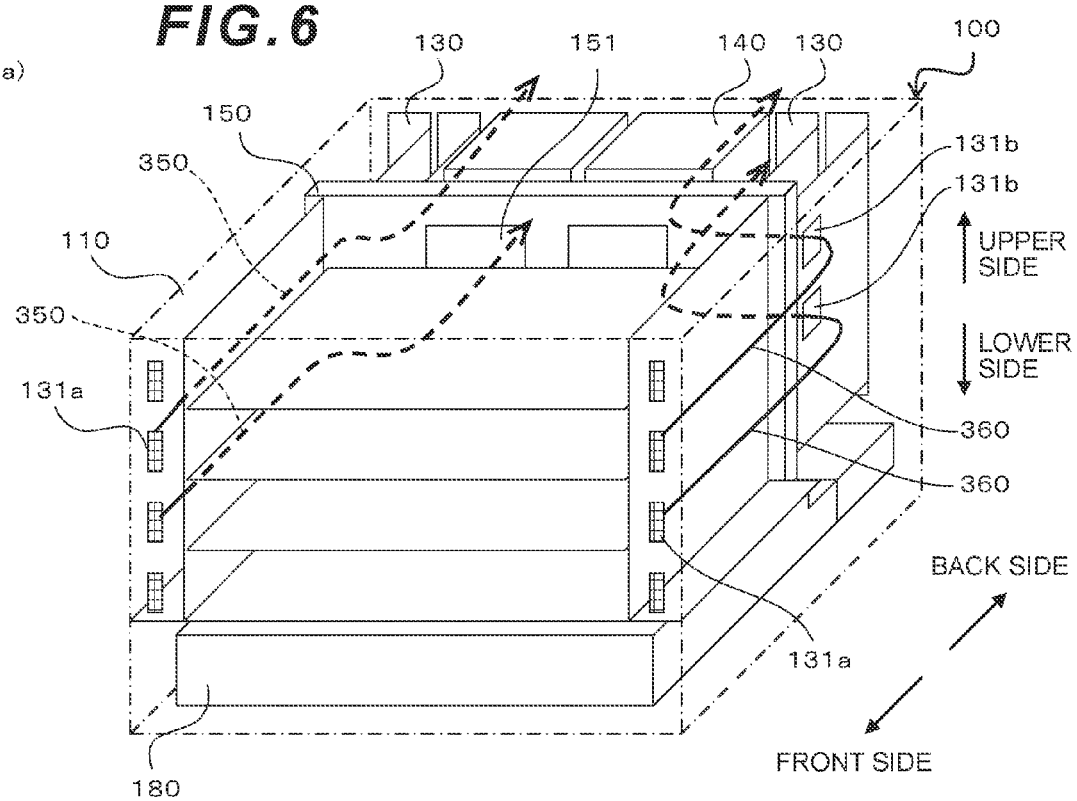
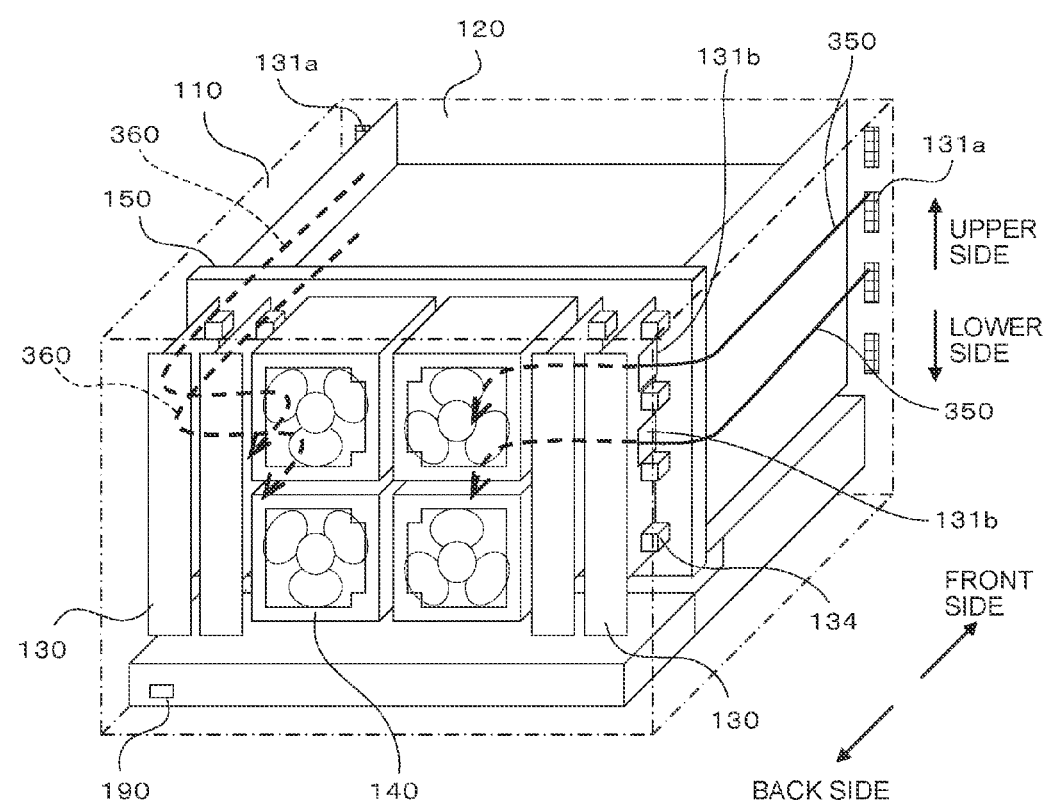
FIG. 6

NETWORK COMMUNICATION DEVICE

CROSS-REFERENCES TO RELATED APPLICATIONS

This application relates to and claims priority from Japanese Patent Application No. 2012-131275, filed on Jun. 8, 2012, the entire disclosure of which is incorporated herein by reference.

BACKGROUND

1. Field of the Invention

The present invention relates to a network communication device having a plurality of removable circuit board units.

2. Description of Related Art

Switches and routers are widely known in a network field as network communication devices for transferring data. Generally, a network communication device like a switch or a router includes, for example, a circuit board unit having an interface function for data transfer in a network, a circuit board unit having a control function controlling the data transfer, and a circuit board unit having a crossbar switch function; and these circuit board units can be removed. Signals are exchanged between the respective circuit board units and electric power is supplied to each circuit board unit via a relay circuit board, that is, a back board, placed in the network communication device. Incidentally, the network communication device is generally mounted on a standard rack which is 19 inch wide.

Recently, the demand for enhancement of processing performance of the network communication device has been increasing and there is a high tendency to adopt an air flow structure of a front-back air supply and exhaust system in consideration of the environment where the relevant device is installed.

For example, an arithmetic processing unit that cools an arithmetic unit with intake air introduced through an intake hole in its front face, cools an input/output unit with the intake air introduced through a vent hole in the front face, gathers the intake air, which has passed through the arithmetic unit, and the intake air, which has passed through the input/output unit, and discharges it from its back side is disclosed as an example of a device which adopts the structure of the front-back air supply and exhaust system (see WO 2010/064299). Also, an electronic device designed as follows is disclosed: a plurality of circuit board units are placed in front of a relay main circuit board, and a cooling unit and a power supply unit are placed side by side on the back side of a relay sub-circuit board with the relay main circuit board placed between the plurality of circuit board units and the cooling unit and power supply unit. Intake air is introduced through a vent hole formed in the front side of each circuit board unit, the introduced intake air is introduced to the cooling unit via the relay circuit board and discharged from the cooling unit, the intake air is further introduced from a vent hole formed on both lateral sides of each circuit board unit, and the introduced intake air is discharged via the power supply unit (see Japanese Patent Application Laid-Open Publication No. 2011-146450).

Moreover, another application (WO 2012/0066732) discloses an electronic device designed so that a plurality of circuit board units are placed in front of a relay main circuit board, and a power supply unit and a cooling unit are placed in order on the back side of a relay sub-circuit board with the relay main circuit board placed between the plurality of circuit board units and the cooling unit and power supply unit. Intake air is introduced through a vent hole formed in the front side of each circuit board unit, and the introduced intake air is introduced via the relay circuit board to the power supply unit and then to the cooling unit and discharged from the cooling unit.

When adopting the structure of the front-back air supply and exhaust system, the following structure can be used: a first circuit board unit to be placed on a front side of a rack is mounted in the rack in a vertical direction, a second circuit board unit is mounted on a back side of the rack, a first cooling unit is placed in an upper part of the front side of the rack, a second cooling unit is placed on an upper side of the second circuit board unit, cooling air which has been introduced through a vent hole in a bottom of the front side of the rack, is introduced via the first circuit board unit to the first cooling unit and via the second circuit board unit to the second cooling unit, and each introduced cooling air is discharged from the first cooling unit or the second cooling unit.

In this case, the cooling unit is placed for each circuit board unit, so that each circuit board unit can be cooled sufficiently. However, if the first circuit board unit is mounted in the vertical direction in the rack, a limitation of the rack width will be imposed on the number of circuit board units to be added and, therefore, it becomes difficult to increase the number of the circuit board units. Particularly in a case of a network communication device, scalability to create devices with the increased or decreased number of the same circuit board units as a lineup will decrease. Also, two types of cooling units are required in order to sufficiently cool each circuit board unit.

On the other hand, it is possible to adopt a configuration to mount the first circuit board unit in a horizontal direction in the rack, place the second circuit board unit on the back side of the first circuit board unit, and place the cooling unit in the second circuit board unit. In this case, cooling air which has passed through each circuit board unit can be cooled by one type of cooling unit and then discharged. However, since the heat which has passed through the first circuit board unit enters the second circuit board unit, it is necessary to use a large-sized cooling unit in order to sufficiently cool the second circuit board unit.

On the other hand, in the case of the device described in the WO 2010/064299, the arithmetic unit is placed in the horizontal direction, thereby making it possible to enhance the scalability. Moreover, since the cooling air which has passed through the arithmetic unit and the cooling air which has passed through the input/output unit are respectively introduced into a fan box, the cooling air which has passed through the arithmetic unit and the input/output unit can be cooled by one type of a fan box.

However, with the structure of the device described in the WO 2010/064299, the cooling air introduced to the input/output unit is bent 180 degrees before being introduced to the fan box and then further bent 180 degrees, so that pressure loss of the cooling air increases. Furthermore, according to the structure of the device described in the WO 2010/064299, the arithmetic processing unit is the one placed on the front face of the rack and the input/output processing unit for inputting and outputting data to and from other devices is placed on the back face of the rack. On the other hand, in the case of the network communication device, a cable(s) connected to an external network is often connected to or disconnected from the font face of the rack for the purposes of construction, maintenance, and management of the network. Accordingly, a circuit board unit equipped with an external interface connector needs to be placed on the front face of the rack. Therefore, in consideration of the maintenance and management of the network communication device, it is necessary to place the circuit board units and the cooling units by adopting a completely different designing idea from that of the structure of the device of the WO 2010/064299.

On the other hand, in the case of the electronic device described in the JP Application Laid-Open Publication No. 2011-146450, the circuit board unit on the front side is placed in the horizontal direction, the cooling unit is placed on the back side, and the power supply units are placed on both sides of the cooling unit, so that the scalability of the circuit board units can be enhanced and the cooling air which has passed through each circuit board unit can be cooled by one type of a cooling unit and then discharged.

However, in the case of the electronic device described in the JP Application Laid-Open Publication No. 2011-146450, a plurality of relay circuit boards are required and the configuration becomes more complicated than that of an electronic device with one relay circuit board. Also, if a circuit board unit(s) which transfers data to other circuit board units, but does not directly communicate with external devices is placed on the front face, a circuit board unit equipped with an external interface connector cannot be placed and, therefore, the network cannot be extended flexibly. Moreover, with the electronic device that allows the circuit board unit, which does not communicate with external devices to be directly coupled to the circuit board unit equipped with the external interface connector in place of the relay circuit board, the circuit board unit located in the middle of a chassis cannot be cooled. Furthermore, with the electronic device described in the WO 2012/0066732, units such as the power supply unit on the back face of the chassis is cooled with the air taken in from the front face of the chassis and warmed by the circuit board unit placed at the front face of the chassis, so that cooling cannot be performed sufficiently.

The present invention was devised in light of the problems of the conventional art and it is an object of the invention to provide a network communication device capable of enhancing cooling efficiency with a simple configuration when adopting the structure of the front-back air supply and exhaust system.

SUMMARY

In order to solve at least one of the above-described problems, the present invention is characterized in that a relay circuit board is placed in the middle of a chassis, a first circuit board unit is located in a horizontal direction in front of the relay circuit board, and a cooling unit and a second circuit board unit are placed side by side behind the relay circuit board, with the relay circuit board placed between the first circuit board unit and the cooling unit and second circuit board unit; electric power is supplied from the power supply unit via the relay circuit board to each unit; a first circuit board unit air passage for allowing intake air introduced through an intake hole in a front side of the first circuit board unit to pass through the first circuit board unit and then introducing it through an opening in the relay circuit board to the cooling unit is formed in the chassis; a second circuit board air passage for allowing intake air introduced through an intake hole in a front face of the chassis to pass through a lateral side of the first circuit board unit and then introducing it through a vent hole in a first partition, which is provided at a lateral side of the first circuit board unit, via the second circuit board unit to the cooling unit is formed; and the second circuit board unit is placed in the second circuit board unit air passage.

According to the present invention, the cooling efficiency can be enhanced with simple configurations when adopting the structure of the front-back air supply and exhaust system.

BRIEF DESCRIPTION OF THE DRAWINGS

FIG. 1 depicts perspective views of an embodiment of the present invention. FIG. 1(a) is a front-side perspective view of a network communication device and FIG. 1(b) is a back-side perspective view of the network communication device.

FIG. 5 depicts perspective views of a cooling unit. FIG. 5(a) is a front-side perspective view of the network communication device and FIG. 5(b) is a back-side perspective view of the network communication device.

FIG. 6 depicts perspective views for explaining air passages of the network communication device. FIG. 6(a) is a front-side perspective view of the network communication device and FIG. 6 (b) is a back-side perspective view of the network communication device.

FIG. 7(a) is a front-side perspective view for explaining the air passages of the network communication device and FIG. 7(b) is a back-side perspective view for explaining the air passages of the network communication device.

FIG. 9(a) is a plan view of the network communication device, FIG. 9(b) is a front view of the network communication device, FIG. 9(c) is a right side view of the network communication device, and FIG. 9(d) is a back view of the network communication device.

DETAILED DESCRIPTION OF PREFERRED EMBODIMENTS

Embodiment

Figure 2:
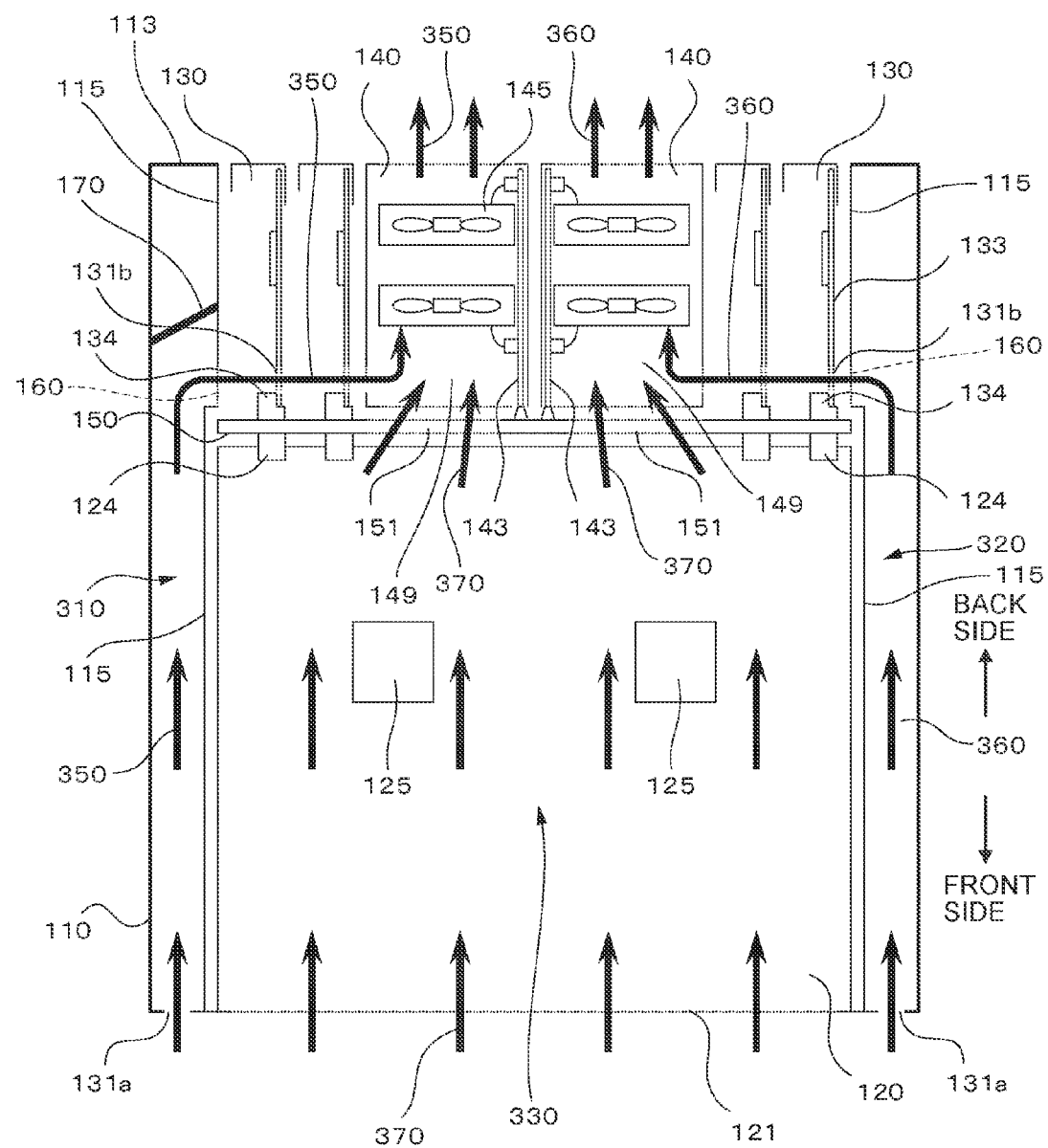
FIG. 2 is a plan view of the network communication device.

An embodiment of the present invention will be explained below with reference to the drawings. FIG. 1 depicts perspective views indicating the schematic configuration of a network communication device according to the present invention. FIG. 1(a) is a front-side perspective view of the network communication device and FIG. 1(b) is a back-side perspective view of the network communication device.

Referring to FIG. 1, a network communication device 100 functions as a device transferring data (called, for example, frames or packets) in a computer network and has a chassis 110 that constitutes a rack. The chassis 110 is formed in a substantially box shape. In the chassis 110, a power supply unit 180 is placed on the bottom side; a relay circuit board 150 (backplane) is placed in an area above the power supply unit 180 and in the middle of a front-back direction of the chassis 110; a plurality of circuit board units 120 are placed in a horizontal direction at positions closer to the front side of the chassis 110 than to the relay circuit board 150; and a plurality of circuit board units 130 and a plurality of cooling units 140 are placed side by side in a direction intersecting with that of the relay circuit board 150 at positions closer to the back side of the chassis 110 than to the relay circuit board 150. Under this circumstance, the plurality of circuit boards 130 are divided into two groups and the circuit board units 130 are divided into the respective groups and placed on both sides of the cooling unit 140.

A plurality of intake holes 131a for introducing intake air to lateral sides of each circuit board unit 130 are formed in an up-down direction (vertical direction) on both sides of a front face of the chassis 110. Moreover, partitions with the circuit board units 120 are provided so that the partitions extend from the intake holes 131a to the back face in the front-back direction. Vent holes that constitute an air passage from the intake hole 131a are formed in the partitions behind the relay circuit board 150. Then, a cooling unit 140 that constitutes an exhaust hole is provided on the back face of the chassis 110. An air flow structure of a front-back air supply and exhaust system is adopted for the chassis 110 by using the intake holes 131a, the vent holes formed in the partitions, and the cooling unit 140.

Each circuit board unit 120 is constructed as a first circuit board unit having a first semiconductor device (not illustrated in the drawing) that has an interface function for data transfer in a network or a control function controlling the data transfer. Each circuit board unit 120 is placed so that it can be freely moved in a horizontal direction along a slot formed in an inside wall of the chassis 110 in the horizontal direction, for example, along a U-shaped rail. Besides the semiconductor device, for example, a plurality of connectors 124 are mounted on each circuit board unit 120. Moreover, a plurality of intake holes 121 are formed side by side in the horizontal direction on a front face of each circuit board unit 120 and a plurality of external interface connectors 122 are arranged in the horizontal direction. A cable 200 is connected in a freely attachable or detachable manner to each external interface connector 122. Incidentally, each intake hole 121 is formed in a mesh shape in order to take in cooling air.

Each circuit board unit 130 is configured as a second circuit board unit having a semiconductor device (not illustrated in the drawing) that has, for example, a crossbar switch function and placed in the vertical direction. Besides the semiconductor device, for example, a plurality of connectors 134 are mounted on each circuit board unit 130.

Each cooling unit 140 has fans 145 for forcing the air, which has passed through each circuit board unit 120, 130, to flow, and a control circuit board (not illustrated in the drawing) for controlling rotations of the fans 145; and is constructed independently from each circuit board unit. Each cooling unit 140 has a connection port for power supply (not illustrated in the drawing), which is formed at a position where the adjacent cooling units 140 are placed close to each other. Under this circumstance, each cooling unit 140 is structured to enable power supply from the relay circuit board 150 by placing the cooling units 140, which are placed separately on the right and left sides, upside down on the right and left sides respectively.

The power supply unit 180 has a power receiving port 190 on the back side and supplies the electric power received through the power receiving port 190 to each circuit board unit 120, 130 and each cooling unit 140 via the relay circuit board 150.

The relay circuit board 150 is configured as a power supply path for electrically connecting each circuit board unit 120, 130, each cooling unit 140, and the power supply unit 180 to each other and is also configured as a transmission path for transmitting data and control signals sent and received between the units. The relay circuit board 150 is formed in a substantially flat plate shape and a plurality of openings 151 for introducing the air, which has passed through each circuit board unit 120, to each cooling unit 140 are formed in a central part of the relay circuit board 150. The respective circuit board units 130 are placed in the vertical direction on this relay circuit board 150 and the connector 124 on each circuit board unit 120 is connected via the relay circuit board 150 to the connector 134 on each circuit board unit 130. In other words, the connector 134 and the connector 124 which are adjacent to each other and between which the relay circuit board 150 is located are directly connected via the relay circuit board 150. Accordingly, the transmission path connecting each circuit board unit 120 and each circuit board unit 130 can be shortened, thereby making it possible to increase the speed of the data transfer.

FIG. 2 is a plan view of the network communication device. Referring to FIG. 2, two semiconductor devices 125 that have an interface function for data transfer in the network or a control function controlling the data transfer are mounted on the circuit board unit 120 and a plurality of connectors 124 are also mounted on the circuit board unit 120. A semiconductor device 135 having a crossbar switch function is mounted on the circuit board unit 130 and a vent hole 131b is formed in the circuit board unit 130 near the relay circuit board 150. The fans 145 are placed in each cooling unit 140 and a control circuit board 143 for controlling, for example, a rotational speed of the fans 145 is also placed in each cooling unit 140. Incidentally, the number of the semiconductor devices 125 mounted in the circuit board unit 120 is not limited to two and one or more semiconductor devices 125 may be mounted.

Under this circumstance, pluralities of air passages 310, 320, 330 are formed respectively in the chassis 110. Each air passage 310 is an air passage for introducing cooling air 350, which has been introduced through the intake hole 131a on the left side of the chassis 110, to the cooling unit 140 and is constructed as a second circuit board unit air passage including the intake hole 131a, a space part between the chassis 110 and a partition 115 provided on the lateral side of the circuit board unit 120, a space part on the back side of the relay circuit board 150, a vent hole 160 formed in the partition 115 on the back side of the relay circuit board 150, the vent hole 131b, and a space part on an introduction hole side of the cooling unit 140. Each air passage 310 which serves as a passage for the cooling air 350 is formed as a linear air passage extending from the intake hole 131a to the back side of the relay circuit board 150, is formed as a curved air passage that is bent by the vent hole 160, which is formed in the partition 115 on the back side of the relay circuit board 150, at an angle of 90 degrees or less to a wall face of the chassis 110 towards the circuit board unit 130, and is further formed as a curved air passage that passes through the vent hole 131b on the back side of the relay circuit board 150, enters a hole (vent hole) 148 formed in a wall face of the cooling unit 140, and is then bent at an angle of 90 degrees or less to the relay circuit board 150 towards the cooling unit 140 by the operation of the cooling fans 145.

Specifically speaking, each cooling air 350 introduced through the intake hole 131a passes through the space part between the chassis 110 and the lateral side of the circuit board unit 120, is then bent by the back side of the relay circuit board 150, is introduced to the vent hole 160 and the vent hole 131b, passes through the vent hole 131b, is bent towards the cooling unit 140 side again and introduced to the cooling unit 140, and is then discharged from the back side of the cooling unit 140 to the back side of the chassis 110.

Referring to FIG. 2, the space part between the outside face of the chassis 110 and the partition 115 provided on the lateral side of the circuit board unit 120 is shielded by a part 113 of the chassis on the back face of the chassis 110. So, even if the cooling air 350 from the intake hole 131a moves straight forward, it will not go straight through and thereby flows to the vent hole 160. Subsequently, the operation of the cooling fans 145 provided in a central area of the back side makes the cooling air 350 move to the cooling unit 140 via the vent hole 131b in the circuit board unit 130 and go through it towards the back face.

Incidentally, instead of the part 113 of the chassis which shields the back face of the chassis 110, a partition 170 may be provided at a position closer to the back side than to the vent hole 160 formed in the partition 115 in order to bend the flow of the cooling air 350 from the intake hole 131a towards the central part of the chassis 110. Moreover, the back face may not be shielded, but the flow of the cooling air 350 may be guided by the operation of the cooling fans provided in the central part of the back face. In this case, the flow of the cooling air 350 which enters the chassis 110 through the intake hole 131a, moves straight forward and goes out of the back face, and the flow of the cooling air 350 which is guided to the vent hole in the back side of the relay circuit board 150 by the operation of the cooling fans 145 and goes out of the cooling unit 140 in the central part of the back face are formed. However, as compared with the configuration which shields the back face, it is possible to prevent retention of the air.

Each air passage 320 is an air passage for introducing cooling air 360, which has been introduced through the intake hole 131a on the right side of the chassis 110, to the cooling unit 140 and is constructed as a second circuit board unit air passage including the intake hole 131a, a space part between the chassis 110 and the partition 115 provided on the lateral side of the circuit board unit 120, the space part on the back side of the relay circuit board 150, the vent hole 160 provided in the partition 115 on the back side of the relay circuit board 150, the vent hole 131b, and the space part on the introduction hole side of the cooling unit 140. Each air passage 320 which serves as a passage for the cooling air 360 is formed as a linear air passage extending from the intake hole 131a to the back side of the relay circuit board 150, is formed as a curved air passage that is bent by the vent hole 160, which is formed in the partition 115 on the back side of the relay circuit board 150, at an angle of 90 degrees or less to the wall face of the chassis 110 towards the circuit board unit 130, and is further formed as a curved air passage that passes through the vent hole 131b on the back side of the relay circuit board 150 and is then bent at an angle of 90 degrees or less to the relay circuit board 150 towards the cooling unit 140 by the operation of the cooling fans 145.

Referring to FIG. 2, the space part between the outside face of the chassis 110 and the partition 115 provided on the lateral side of the circuit board unit 120 is shielded by the part 113 of the chassis on the back face of the chassis 110. So, even if the cooling air 360 from the intake hole 131a moves straight forward, it will not go straight through and thereby flows to the vent hole 160. Subsequently, the operation of the cooling fans 145 provided in the central area of the back side of the chassis makes the cooling air 360 move to the cooling unit 140 via the vent hole 131b in the circuit board unit 130 and go through it towards the back face.

Incidentally, instead of the part 113 of the chassis which shields the back face of the chassis 110, the partition 170 may be provided at a position closer to the back side than to the vent hole 160 formed in the partition 115 in order to bend the flow of the cooling air 360 from the intake hole 131a towards the central part of the chassis 110. Moreover, the back face may not be shielded, but the flow of the cooling air 360 may be guided by the operation of the cooling fans provided in the central part of the back face. In this case, the flow of the cooling air 360 which enters the chassis 110 through the intake hole 131a, moves straight forward and goes out of the back face and the flow of the cooling air 360 which is guided to the vent hole in the back side of the relay circuit board 150 by the operation of the cooling fans 145 and goes out of the cooling unit 140 in the central part of the back face are formed. However, as compared with the configuration which shields the back face, it is possible to prevent retention of the air.

Specifically speaking, each cooling air 360 introduced through the intake hole 131a passes through the space part between the chassis 110 and the lateral side of the circuit board unit 120, is then bent by the back side of the relay circuit board 150, is introduced to the vent hole 160 and the vent hole 131b, passes through the vent hole 131b, is bent towards the cooling unit 140 side again and introduced to the cooling unit 140, and is then discharged from the back side of the cooling unit 140 to the back side of the chassis 110. Under this circumstance, the cooling air 350 and the cooling air 360 flow in opposite directions to each other on the back side of the relay circuit board 150 and are introduced to at least one of the cooling units.

Each air passage 330 is an air passage for introducing cooling air 370, which has been introduced through an intake hole 121 of the circuit board unit 120, to the cooling units 140 and is configured as a first circuit board unit air passage including the intake hole 121, a space part around the circuit board unit 120, the openings 151 in the relay circuit board 150, a space part on the back side of the relay circuit board 150, and a space part 149 on the introduction side of the cooling units 140.

Specifically speaking, the cooling air 370 which has been introduced from the intake hole 121 passes through, for example, the semiconductor device(s) 125 on the circuit board unit 120, is then introduced via the openings 151 to the cooling units 140, and is discharged from the back side of the cooling units 140 to the back side of the chassis 110.

Under this circumstance, the plurality of circuit board units 130 placed on the left side are located in each air passage 310 and the plurality of circuit board units 130 placed on the right side are located in each air passage 320. Each air passage 310, 320 is bent at an angle of 90 degrees or less only twice, thereby making it possible to reduce the pressure loss at each air passage 310, 320 and enhancing cooling efficiency in each circuit board unit 130.

Figure 3:
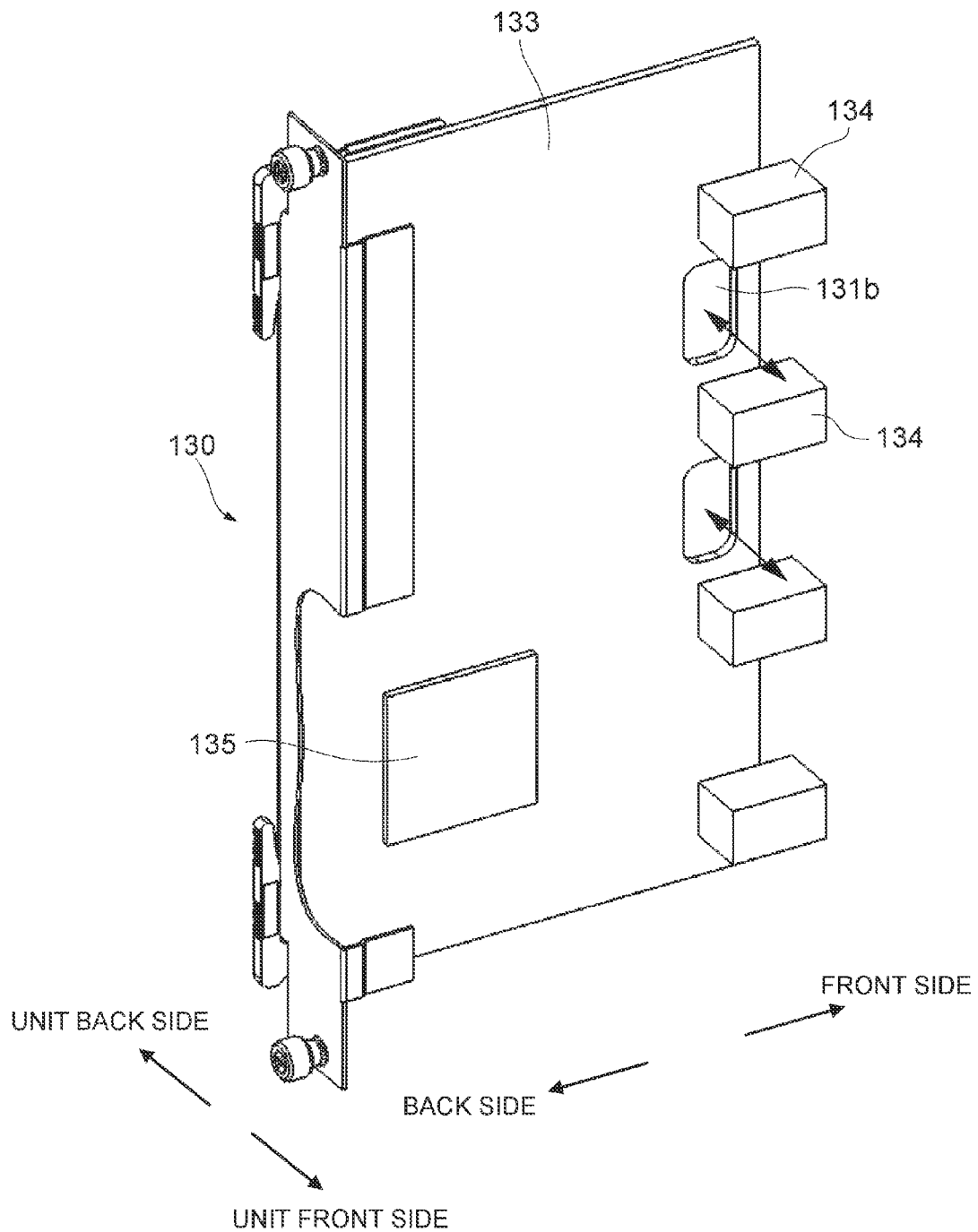
FIG. 3 is a perspective view of a circuit board unit from which a radiator part is removed.

FIG. 3 is a perspective view of a circuit board unit from which a radiator part has been removed. Referring to FIG. 3, the circuit board unit 130 has a circuit board 133; and a semiconductor device 135, which functions as a processing unit for executing various processing at a crossbar switch, is mounted on the circuit board 133 and a plurality of connectors 134 are also mounted on the circuit board 133. Each connector 134 is connected to the semiconductor device 135 and placed along the relay circuit board 150. Each connector 134 is electrically connected to each connector 124, which is connected to the semiconductor device 125 on each circuit board unit 120, via the relay circuit board 150. Furthermore, the vent hole 131b is formed in each dead space area between the connectors 134 in each circuit board unit 130. Incidentally, the vent hole 131b does not have to be of a through-hole shape and may be of a notch shape formed by cutting an end of the circuit board 133.

Figure 4:
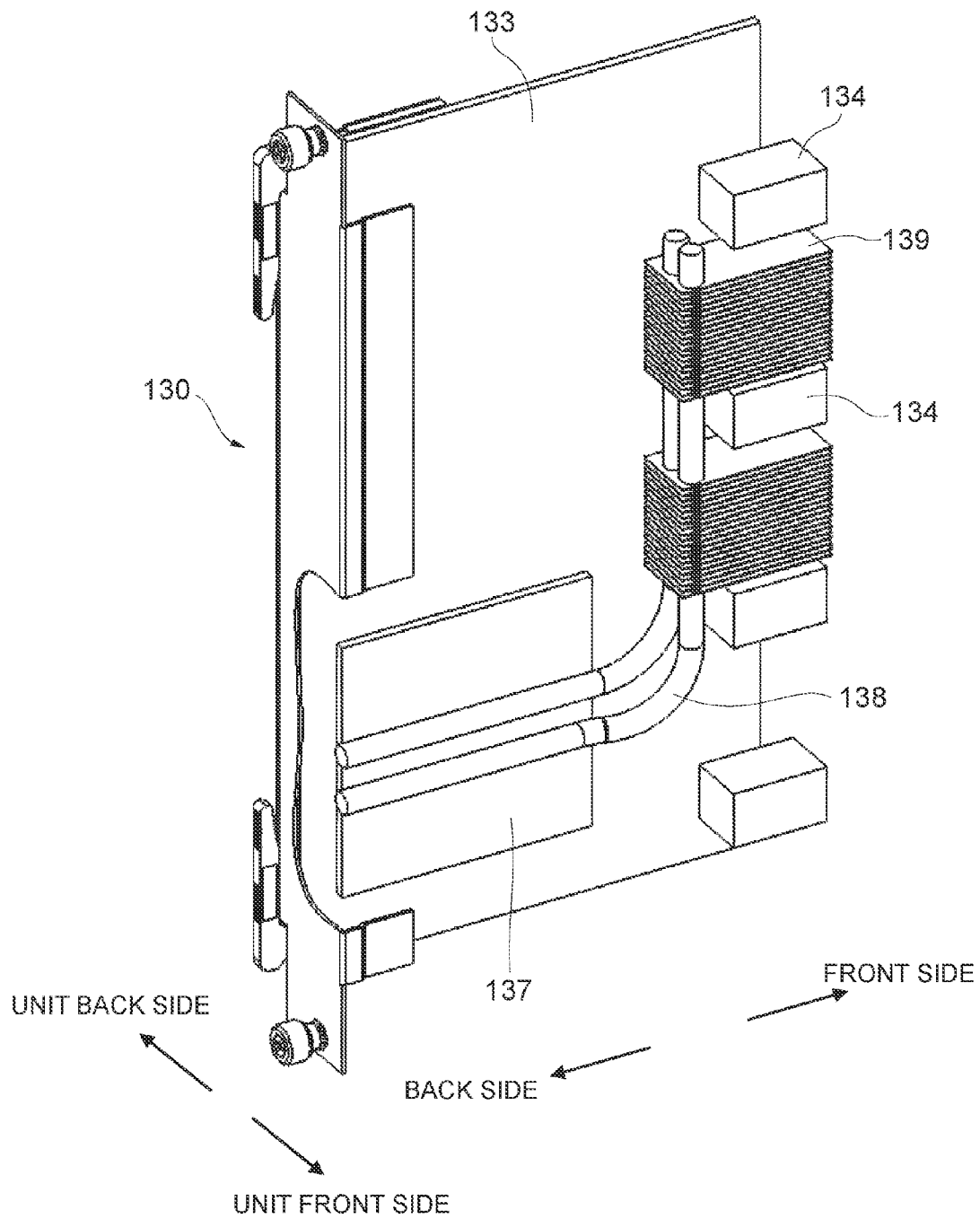
FIG. 4 is a perspective view of the circuit board unit on which the radiator part is mounted.

FIG. 4 is a perspective view of a circuit board unit on which a radiator part is mounted. Referring to FIG. 4, a plate 137 for radiating heat generated from the semiconductor device 135 is placed on the circuit board 133 at a position covering the semiconductor device 135. Furthermore, a fin 139 which becomes a radiator plate is placed in each vent hole 131b. Each fin 139 and the plate 137 are coupled to each other via heat pipes 138.

Specifically speaking, the plurality of vent holes 131b are formed in each circuit board unit 130 in areas overlapping with each air passage 310 or each air passage 320, the semiconductor device 135 is placed at a position distant from each air passage 310 or each air passage 320, the heat pipes 138 are mounted on this semiconductor device 135 via the plate 137, the fin (radiator fin) 139 is placed in each vent hole 131b, and the heat pipes 138 mounted on the semiconductor device 135 are coupled to each fin 139.

Accordingly, when the cooling air 350 or 360 passes through each vent hole 131b via each fin 139, heat generated from the semiconductor device 135 is conducted via the plate 137 and the heat pipes 138 to the fins 139, and the heat conducted to the fins 139 is cooled by the cooling air 350, 360 which passes through each fin 139. Specifically speaking, the heat transported from the semiconductor device 135 via the heat pipes 138 to each fin 139 is discharged by the cooling air 350, 360.

The semiconductor device 135 is cooled by using the plate 137, the heat pipes 138, and the fins 139. Therefore, even in a case where the circuit board unit 130 is thin, sufficient cooling effect can be obtained and the size of the plate 137 can be reduced as compared to a case where a heat sink which requires a large size and height for the purpose of heat radiation. As a result, a packaging density of the circuit board 133 can be increased.

Incidentally, a vent hole 131b in which the fin 139 is not mounted may be formed in the circuit board unit 130. For example, such vent hole 131b may be formed between the connectors 134 on the circuit board 133. Moreover, the number of the vent holes 131b is not limited to two and one or more vent holes 131b may be formed. The same applies to the vent hole 131b in which the fin 139 and the plate 137 are mounted.

FIG. 5 depicts perspective views of the cooling unit. FIG. 5(a) is a front-side perspective view of the network communication device and FIG. 5(b) is a back-side perspective view of the network communication device.

Referring to FIG. 5(a), each air passage 310 indicates the vent holes 148 formed on a side face of the cooling unit 140 and a space part 149 provided on the relay circuit board side where each air passage 330 is formed. FIG. 5(b) depicts the fan 145, the vent holes 148, and the vent holes 147 formed on the upper face and the bottom face of the cooling unit. The vent holes 147 are formed to introduce air to between the cooling units piled at least upward or downward.

Figure 9:
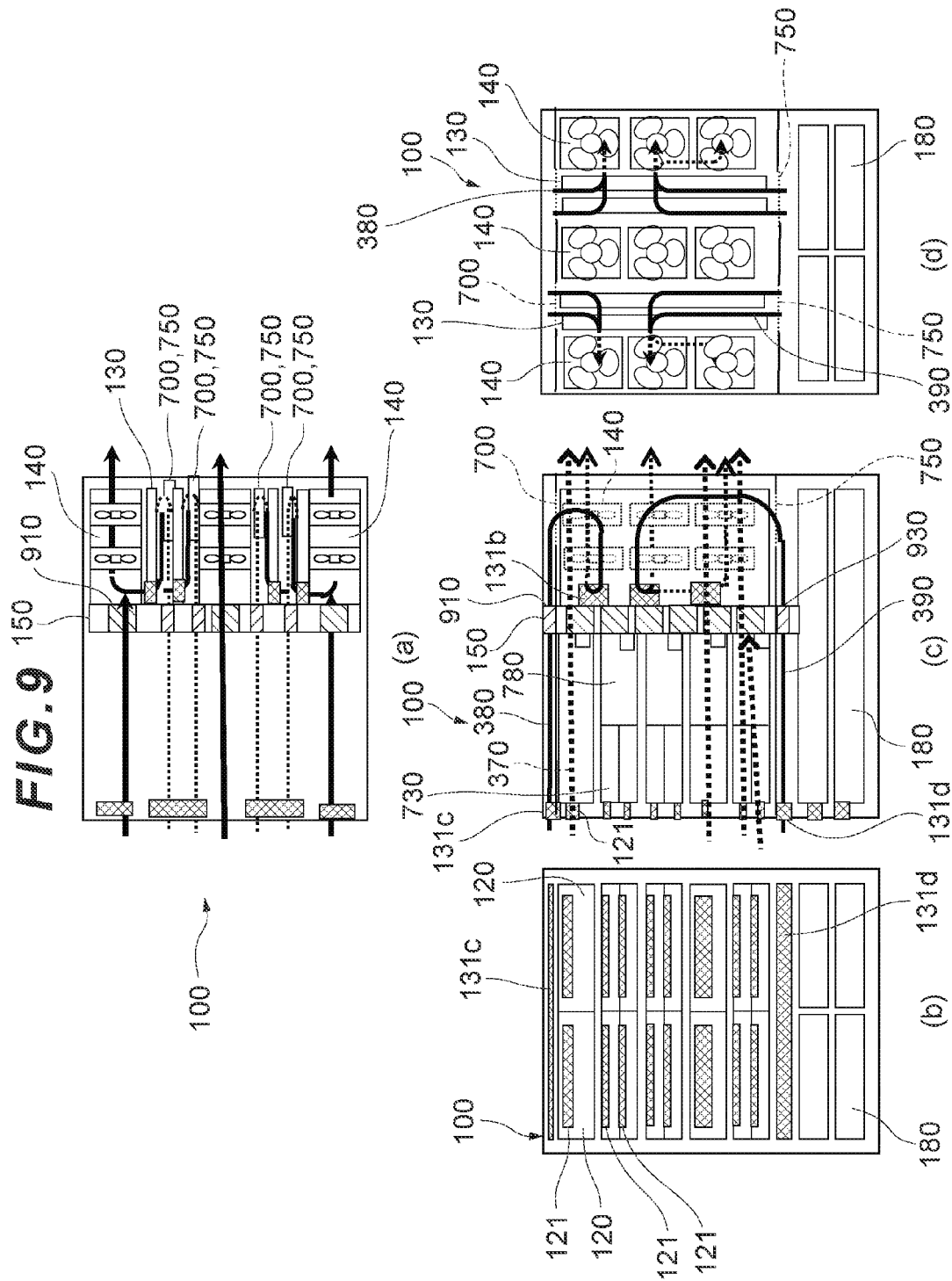
FIG. 9 depicts configuration diagrams for explaining a variation of the present invention.

Incidentally, the vent holes 147, 148, and the space part 149 are explained by omitting part of them in other perspective views or FIG. 9.

FIG. 6 depicts perspective views of the network communication device. FIG. 6(a) is a front-side perspective view for explaining air passages in the network communication device and FIG. 6(b) is a back-side perspective view for explaining the air passages in the network communication device.

Referring to FIG. 6, a plurality of air passages 310 for introducing the cooling air 350, which has been introduced through the intake holes 131a on the left side of the chassis 110, to the cooling units 140 and a plurality of air passages 320 for introducing the cooling air 360, which has been introduced through the intake holes 131a on the right side of the chassis 110, to the cooling units 140 are formed in the chassis 110.

Since each air passage 310, 320 is bent at an angle of 90 degrees or less only twice, it is possible to reduce the pressure loss at the air passages 310, 320 and enhance the cooling efficiency at each circuit board unit 130.

Figure 7:
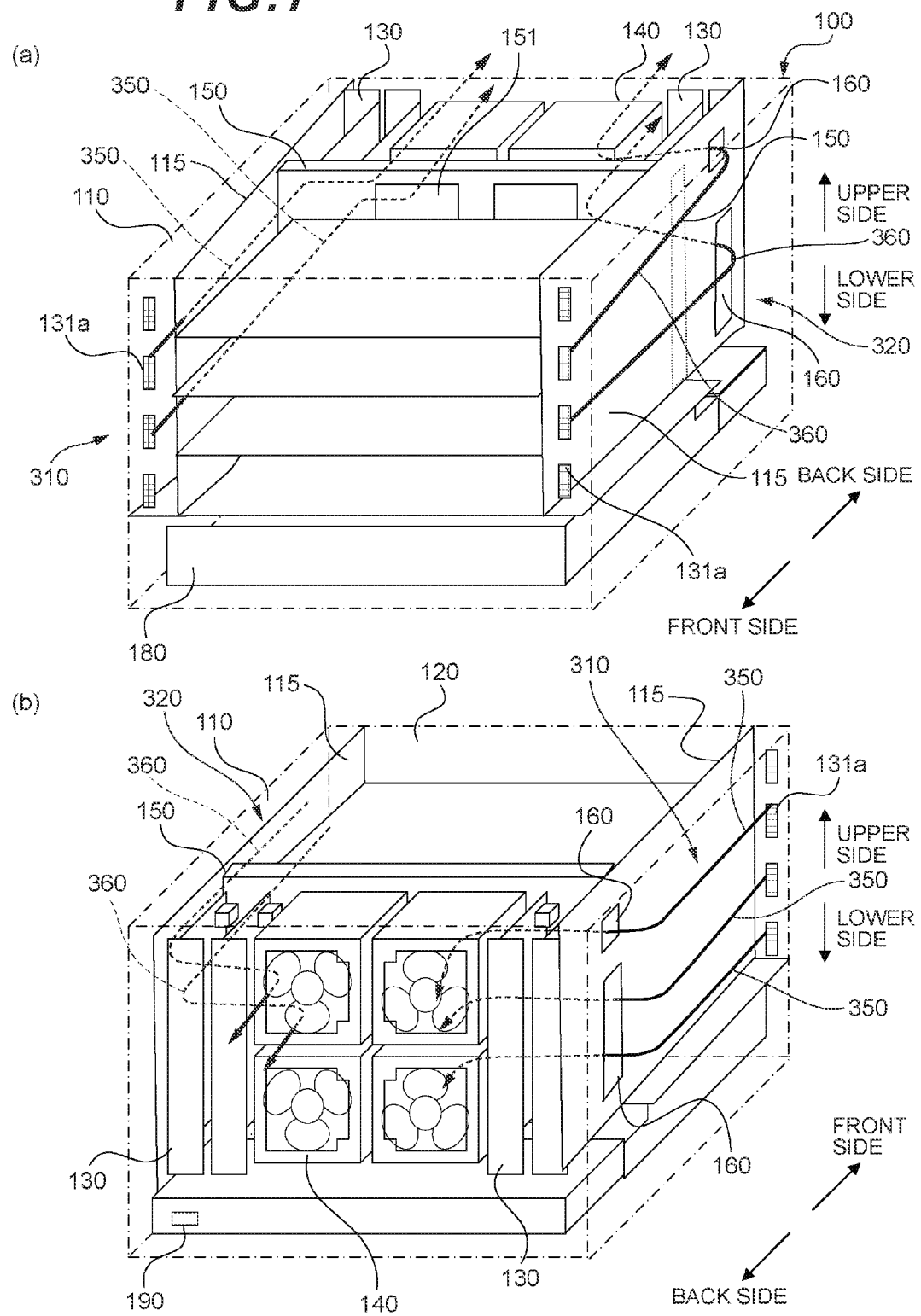
FIG. 7 depicts perspective views of the network communication device.

FIG. 7 depicts perspective views of the network communication device. FIG. 7(a) is a front-side perspective view for explaining air passages in the network communication device and FIG. 7(b) is a back-side perspective view for explaining the air passages in the network communication device. With the chassis 110 in FIG. 7, the partition 115 which is omitted in FIG. 1 or 6 is illustrated; and a vent hole(s) 160 is formed in the partition 115 behind the relay circuit board 150 and on the back side of the chassis 110. Incidentally, the number of the vent holes 160 is not limited and one or more vent holes 160 may be formed as long as the air passages 310 or 320 are formed.

Referring to FIG. 7, a plurality of air passages 310 for allowing the cooling air 350, which has been introduced through the intake holes 131a on the left side of the chassis 110, to pass through between the partition 115 and the side face of the chassis and introducing it via the vent hole 160 to the cooling units 140 and a plurality of air passages 320 for allowing the cooling air 360, which has been introduced through the intake holes 131a on the right side of the chassis 110, to pass through between the partition 115 and the side face of the chassis and introducing it via the vent hole 160 to the cooling units 140 are formed in the chassis 110. Other structures are the same as those explained about the air passages with reference to FIG. 2 and FIG. 6. The partition 115 prevents the air from flowing from the intake holes 131a to a slot, into which a circuit board unit 120 can be inserted, and is provided to form the air passages 310 and 320 through which the air flows to the vent holes 131b in the circuit board units 130.

Incidentally, an example of the partition 115 which extends to the back face of the chassis 110 has been explained; however, as shown in FIG. 5, the partition 115 may be configured to extend to the back face of the relay circuit board 150, but not to the back face of the chassis 110. The partition 115 can form the air passages 310 and 320 by extending to the back face of the relay circuit board 150.

Figure 8:
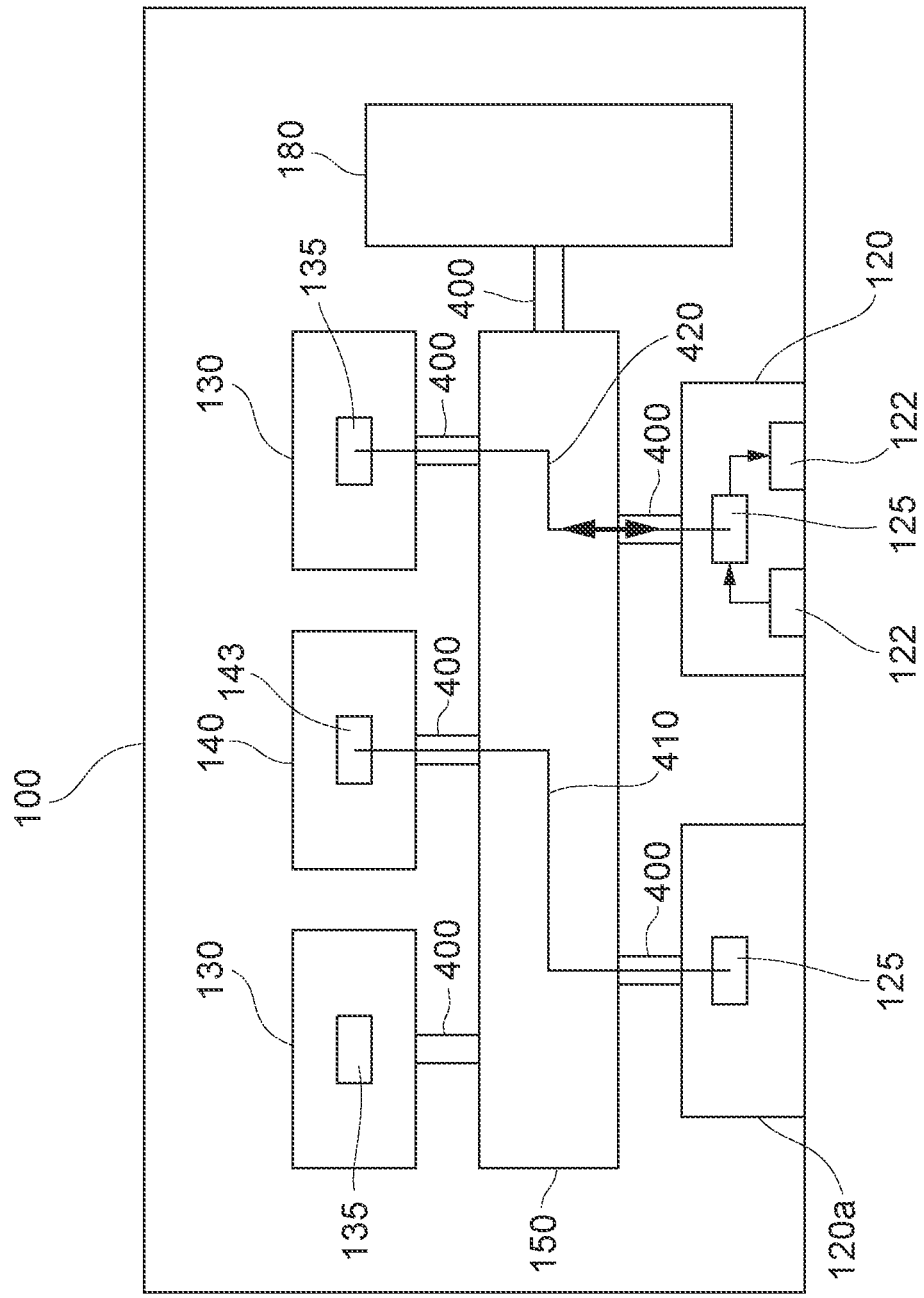
FIG. 8 is a circuit configuration diagram of the network communication device.

FIG. 8 is a circuit configuration diagram of the network communication device. Referring to FIG. 8, the relay circuit board 150 is coupled to each control circuit board 120, 130, the cooling unit 140, and the power supply unit 180 via a transmission path 400. The transmission path 400 constitutes a power supply path and is also configured as a transmission path for transmitting data and control signals. Under this circumstance, the power supply unit 180 can supply electric power to each circuit board unit 120, 130 and the cooling unit 140 via the transmission path 400 and the relay circuit board 150 and the transmission path 400. The transmission path 400 is constituted from the connectors 134, 124.

Now, for example, if one circuit board unit 120 among the plurality of circuit boards units 120 is configured as a circuit board unit 120a for a control circuit, this circuit board unit 120a for the control circuit is configured as a control unit for supervising and controlling the entire network communication device. In this case, the circuit board unit 120a for the control circuit outputs control signals for controlling each unit via the transmission path 400 and the relay circuit board 150 to the circuit board units 120, 130, the cooling units 140, and the power supply unit 180, respectively.

For example, the semiconductor device 125 of the circuit board unit 120a for the control circuit outputs a control signal 410 for controlling the fans 145 to the control circuit board 143 of the cooling unit 140. The fans 145 rotate according to the control signal 410, thereby forming the air passages for the cooling air 350, 360, 370.

On the other hand, if other circuit board units 120 are configured as circuit board units having an interface function transferring data (for example, packet transfer) or a control function controlling the data transfer, the semiconductor device 125 of each such circuit board unit 120 is configured as a data transfer control unit for controlling transfer of data 420 input from the external interface connector 122. For example, the semiconductor device 125 of the circuit board unit 120 transfers the data 420, which is input from the external interface connector 122, via the transmission path 400 and the relay circuit board 150 to the circuit board unit 130 and transfers the data 420, which has been transferred from the circuit board unit 130, externally via the external interface connector 122.

Moreover, the circuit board unit 130 outputs data, which is input from the circuit board unit 120, to the circuit board unit 120 corresponding to a transfer destination decided by the data transfer control unit, executes processing on the data 420 which is externally input via the circuit board unit 120, and outputs the data 420 to transfer it externally.

According to this embodiment, the cooling efficiency can be enhanced with a simple configuration when adopting the structure of the front-back air supply and exhaust system. Moreover, since each circuit board unit 120 is placed in the horizontal direction in the chassis 110, the scalability can be enhanced. Furthermore, since each air passage 310, 320 is bent at an angle of 90 degrees or less only twice, it is possible to reduce the pressure loss at the air passages 310, 320 and enhance the cooling efficiency at each circuit board unit 130. Moreover, the cooling air 370 which has passed through each circuit board unit 120 and the cooling air 350, 360 which has passed through each circuit board unit 130 can be discharged by using one type of cooling units 140 without providing a dedicated cooling unit.

Moreover, the semiconductor device 135 is cooled by using the plate 137, the heat pipes 138, and the fins 139. So, even if the circuit board unit 130 is thin, a sufficient cooling effect can be obtained and the size of the plate 137 can be reduced and the packaging density of the circuit board 133 can be increased as compared to the case where a heat sink which requires a large size and height for heat radiation is used. Furthermore, since each vent hole 131b is formed in a dead space between the connectors 134, the packaging density of the circuit board 133 can be increased more.

Moreover, since the connectors 134 and the connectors 124 which are adjacent to each other and between which the relay circuit board 150 is located are directly connected via the relay circuit board 150, the length of the transmission path connecting each circuit board unit 120 and each circuit board unit 130 can be shortened and the speed of data transfer can be increased.

(Variation)

FIG. 9 depicts configuration diagrams for explaining a variation of a network communication device. FIG. 9(a) is a plan view of the network communication device, FIG. 9(b) is a front view of the network communication device, FIG. 9(c) is a right side view of the network communication device, and FIG. 9(d) is a back view of the network communication device.

Referring to FIG. 9, a plurality of circuit board units 120 of different sizes are placed in two rows in the horizontal direction in the chassis 110; and the circuit board units 130 and the cooling units 140 are divided and placed in three sections. Then, the relay circuit board 150 is placed between the plurality of circuit board units 120 and the cooling units 140 or the circuit board units 130.

A plurality of intake holes 131c are formed in the upper part of the front side of the chassis 110 and a plurality of intake holes 131d are formed below the circuit board unit 120 placed at the bottom. An air passage for cooling air 380 moving through the upper side of the chassis 110 and an air passage for cooling air 390 moving through the bottom side of the chassis 110 are formed in the chassis 110.

With each circuit board unit 120, a plurality of intake holes 121 are placed side by side in the horizontal direction in the same manner as in the aforementioned embodiment. The cooling air 370 introduced through these intake holes 121 form the air passages in the same manner as in the aforementioned embodiment. The circuit board units 130 have the vent holes 131b in the same manner as shown in FIG. 3.

Moreover, the power supply unit 180 may have an intake hole(s) on the front face of the chassis. Cooling air which has been introduced through the intake hole(s) and flows towards the cooling units 140 on the back side of the chassis may be used to cool the power supply unit 180.

FIG. 9(c) is a diagram as viewed transparently from the side face of the chassis. A plurality of circuit board units 120 of different sizes are placed in two rows in the horizontal direction on the front side of the chassis 110; and the circuit board units 130 and the cooling units 140 are divided and placed in three sections on the back side of the chassis. Then, the relay circuit board 150 is placed between the plurality of circuit board units 120 and the cooling units 140 or the circuit board units 130.

Moreover, since a circuit board unit 120 at the top of the front face of the chassis is a unit having a function that controls other circuit board units 120 and 130, the cooling units 140, and the power supply unit 180, it does not have the external interface connector 122.

The circuit board units 120 other than the above-described circuit board unit 120 are network interfaces equipped with the external interface connectors 122 adjacent to the intake holes 121 on the front side of the chassis. Moreover, the circuit board unit 120 may be composed of a plurality of circuit board units. For example, as depicted in FIG. 9(c), the circuit board unit 120 includes a circuit board unit 730 which is equipped with the external interface connector and has an interface function inputting and outputting data externally and a circuit board unit 780 having a control function controlling the data transfer. The circuit board unit 730 and the circuit board unit 780 are connected via a connector and transfer data.

Incidentally, the circuit board unit 730 equipped with the external interface connector includes a circuit board unit, whose width and height as seen from the front face of the chassis are half those of the circuit board unit 120 according to Embodiment 1 or a circuit board unit whose width only is half that of the circuit board unit 120 according to Embodiment 1. The width and height vary depending on the performance (for example, circuit capacity) of the circuit board unit 780.

As depicted in FIG. 9(c), the cooling air 380 which has been introduced through each intake hole 131c passes through a space part between the chassis 110 and the circuit board unit 120 at the top and a vent hole 910 formed in the relay circuit board 150, moves straight to the back face of the chassis 110, bends downwards from a vent hole 700 formed in an upper part of the circuit board unit 130, and is then introduced to the circuit board unit 130.

Subsequently, as depicted in FIG. 9(a), the cooling air 380 passes through the vent hole 131b in the circuit board unit 130 towards the cooling unit 140, is then introduced through a vent hole in the cooling unit 140, and is discharged from the cooling unit 140.

On the other hand, as depicted in FIG. 9(c), cooling air 390 which has been introduced through the intake hole 131d passes through a space part between the circuit board unit 120 at the bottom and the power supply unit 180 and a vent hole 930 formed in the relay circuit board 150, then bends upwards at the back face of the relay circuit board 150 towards a vent hole 750 formed in a lower part of the circuit board unit 130, and is introduced to the circuit board unit 130.

Subsequently, as depicted in FIG. 9(a), the cooling air 390 passes through the vent hole 131b and is then introduced to the cooling unit 140 and discharged from the cooling unit 140.

Incidentally, the vent holes which introduce the cooling air 380 and 390 are provided on the right and left sides of the cooling units 140 in the same manner as in FIG. 2 of Embodiment 1.

The cooling air 370 is introduced through the vent hole 920 in the relay circuit board 150 and then through the vent hole formed opposite the exhaust hole in the cooling unit 140 to the cooling unit 140 and then discharged from the cooling unit 140 in the same manner as depicted in FIG. 9(a), (c) and Embodiment 1.

Figure 10:
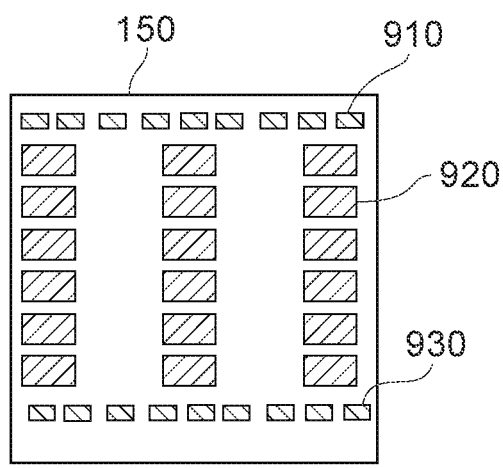
FIG. 10 is a configuration diagram of a relay circuit board (backplane).

FIG. 10 is a configuration diagram of the relay circuit board 150 explained with reference to FIG. 9.; and a plurality of vent hole 910 which form the air passage for the cooling air 380 introduced through the intake holes 131c, a plurality of vent holes 930 which form the air passage for the cooling air 390 introduced through the intake holes 131d, and a plurality of vent holes 920 which form the air passage for the cooling air 370 introduced through the intake holes 121 are placed from the right to the left on the relay circuit board 150. The vent holes in the relay circuit board 150 which form the air passages for the cooling air 380 and 390 are respectively different. Connectors to be connected to the circuit board 330, the control circuit board 143 of the cooling unit 140, and the power supply unit 180 and a transmission path for transmitting signals between the boards and the units are placed on the relay circuit board 150 on each of the front side and back side of the chassis. The transmission path constitutes a power supply path and is configured as a transmission path for transmitting data and control signals.

In this case, the cooling air 380, 390 passes through the back side of the circuit board unit 130. Specifically speaking, the cooling air 380, 390 passes through the upper side of the semiconductor device 135 on the circuit board 133, so that the semiconductor device 135 can be cooled without placing the heat pipes 138 or the fins 139 on the circuit board 133.

According to the variation, the semiconductor device 135 can be cooled without placing the heat pipes 138 or the fins 139 on the circuit board 133.

Moreover, in this variation unlike the aforementioned embodiment, the cooling air 380 and 390 is introduced from the upper part and lower part of the circuit board units 130 placed vertically, thus it is possible to have less influence of cooling of other circuit board units placed in the right-left direction of the chassis 110. The same applies even when the circuit board unit 130 depicted in FIG. 4, which is different from this variation, is used; and cooling can be performed efficiently by using the cooling air 380, 390 introduced from the upper part and the lower part.

Incidentally, the configuration above can be formed with either one of the cooling air 380 and 390. In other words, either the intake holes 131c or the intake holes 131d may be used and either one of the vent holes in the relay circuit board 150 may be used.

Moreover, when the circuit board unit 130 in FIG. 4 is used, the positions of the vent holes 700 and 750 formed in the back of the relay circuit board 150 may be aligned in a straight line in the vertical direction with the vent holes 131b indicated in FIG. 9(c).

Moreover, the positions of the vent holes 700 and 750 may be other than those depicted in FIG. 9 and may be on the back side of the relay circuit board 150 in the upper part and lower part relative to the circuit board units 130.

Furthermore, a chassis equipped with the intake holes 131a, 131b, 131c, 131d as explained in the embodiment and the variation may be used.

Moreover, the embodiment and the variation have described examples of the network communication device for sending and receiving information to and from servers or the like; however, the present invention can also be applied to an electronic device having a semiconductor device for processing at least either one of analogue signals and digital signals. Moreover, the present invention can be applied to an information processing device such as a computer device equipped with information processing resources such as CPUs (Central Processing Units), memories, and input/output interfaces.

Incidentally, the present invention is not limited to the aforementioned embodiment and includes various variations. For example, when forming the vent holes 131b in each circuit board unit 130, it is possible to adopt the configuration to form the vent holes 131b in a substantially central part of each circuit board unit 130 in the front-back direction of each circuit board unit 130, place one large-capacity cooling unit 140 on both right and left sides, and bend the air passages 310, 320 at an angle of 45 to 90 degrees or less only once. In this case, it is possible to reduce the pressure loss at each air passage 310, 320 more and enhance the cooling efficiency of each circuit board unit 130 more.

Moreover, the configuration to bend the air passages 310 and 320 at an angle of 45 to 90 degrees or less only once can be adopted by forming a virtual line, which connects the ends of the relay circuit board 150 in the horizontal (right and left) direction of the relay circuit board 150 and the cooling air introduction hole of each cooling unit 140 and forms an angle of 45 to 90 degrees or less relative to the inside wall of the chassis 110 in the front-back direction of the chassis 110 among the inside walls of the chassis 110, and forming the vent holes 131b of each circuit board unit 130 along this virtual line. Moreover, the configuration of a variation may be added to the configuration of the embodiment. Furthermore, the configuration of a variation can be added to, or deleted from, or replaced with, part of the configuration of the embodiment.

Furthermore, part or all of each aforementioned configuration, function, processing unit, and so on may be realized by hardware by, for example, designing them in integrated circuits. Also, each of the aforementioned configurations, functions, processing units and so on may be realized by software by processors interpreting and executing programs for realizing each of the functions. Information such as programs, tables, and files for realizing each of the functions may be recorded and retained in memories, storage devices such as hard disks and SSDs (Solid State Drives), or storage media such as IC (Integrated Circuit) cards, SD (Secure Digital) memory cards, and DVDs (Digital Versatile Discs).

Furthermore, regarding control signals and data, only those which are considered to be necessary for explanation are indicated and not all control signals or data are necessarily indicated in terms of products.

Reference signs are as follows: the sign 100 is the network communication device, the sign 110 is the chassis, the sign 120 is the circuit board unit, the sign 121 is the intake hole, the sign 122 is the external interface connector, the sign 124 is the connector, the sign 130 is the circuit board unit, the sign 131*a* is the intake hole, the sign 131*b* is the vent hole, the signs 131*c*, 131*d* are the intake holes, the sign 140 is the cooling unit, the sign 145 is the fan, the sign 150 is the relay circuit board, the sign 151 is the opening, the sign 125 is the semiconductor device, the sign 135 is the semiconductor device, and the sign 180 is the power supply unit.

What is claimed is:

1. A network communication device:
  wherein a relay circuit board coupled to a power supply unit is placed in a vertical direction in the middle of a chassis; a plurality of first circuit board units, each of which includes a first semiconductor device, are arranged in a horizontal direction in the chassis on a side of a front side of the chassis than to the relay circuit board; one or more cooling units equipped with a fan and a plurality of second circuit board units, each of which includes a second semiconductor device, are arranged side by side in the chassis on a side of a back side of the chassis than to the relay circuit board; and each first circuit board unit, each second circuit board unit, and each cooling unit are coupled to each other via the relay circuit board and electric power from the power supply unit is supplied via the relay circuit board to each first circuit board unit, each second circuit board unit, and each cooling unit;
  wherein a plurality of first intake holes for introducing intake air to a lateral side of each first circuit board unit are formed in a front face of the chassis and a first exhaust hole for discharging cooling air discharged from the cooling unit to outside of the chassis is formed in a back face of the chassis;
  wherein a plurality of second intake holes are formed in a front side of each first circuit board unit;
  wherein a plurality of openings for introducing the intake air, which has been introduced from each of the plurality of second intake holes to around each first circuit board unit, to the cooling unit are formed in the relay circuit board;
  wherein in the chassis a plurality of first circuit board unit air passages including each second intake hole, a first space part around each first circuit board unit, each opening in the relay circuit board, and a second space part between a back side of the relay circuit board and the cooling unit are formed; and a plurality of second circuit board unit air passages including each first intake hole, a third space part between the chassis and a first partition provided on a lateral side of each first circuit board unit, a vent hole formed on the back side of the relay circuit board within the first partition, and a fourth space part between the back side of the relay circuit board and the cooling unit are formed;
  wherein any of the second circuit board units is placed within each second circuit board unit air passage.

2. The network communication device according to claim 1,
  wherein the plurality of second circuit board units are divided and placed on both sides of the plurality of cooling units, which are placed between the second circuit board units, and each second circuit board unit air passage is formed on both lateral sides of each first circuit board unit.

3. The network communication device according to claim 1,
  wherein a second partition for shielding the back side of the chassis is placed in the third space part on a side of the back side of the chassis than to the vent hole in the first partition.

4. The network communication device according to claim 1,
  wherein a plurality of vent holes are formed in each second circuit board unit in an area overlapping with each second circuit board unit air passage, the second semiconductor device is placed at a position distant from each second circuit board unit air passage, a heat pipe is mounted on the second semiconductor device via a plate, a radiator fin is placed in each vent hole, and the heat pipe mounted on the second semiconductor device is coupled to each radiator fin.

5. The network communication device according to claim 1,
  wherein a plurality of first connectors connected to the first semiconductor device are placed at each first circuit board unit and along the relay circuit board, a plurality of second connectors connected to the second semiconductor device are placed at each second circuit board unit and along the relay circuit board, and each first connector and each second connector are electrically connected via the relay circuit board.

6. The network communication device according to claim 5,
  wherein each vent hole is formed in an area between the respective second connectors in each second circuit board unit.

7. The network communication device according to claim 1,
  wherein the first semiconductor device placed in one first circuit board unit of the respective first circuit board units is configured as a control unit for supervising and controlling the entire each unit and the control unit outputs a control signal for controlling each unit to each unit via the relay circuit board.

8. The network communication device according to claim 1,
  wherein the first semiconductor device placed in one first circuit board unit of the respective first circuit board units is configured as a data transfer control unit for controlling data transfer; and the first circuit board unit in which the first semiconductor device with the data transfer control unit configured therein is placed has an external interface connector, to or from which a cable can be connected or disconnected, transfers data externally input via the external interface connector to any of the second circuit board units via the relay circuit board, and transfers the data, which has been transferred from the second circuit board unit, externally via the external interface connector.

9. The network communication device according to claim 1,
  wherein an external interface connector to or from which a cable can be connected or disconnected is placed at a front side of the first circuit board unit with the second intake hole.

10. A network communication device
  wherein a relay circuit board coupled to a power supply unit is placed in a vertical direction in the middle of a chassis; a plurality of first circuit board units, each of which includes a first semiconductor device, are arranged in a horizontal direction in the chassis on a side of a front side of the chassis than to the relay circuit board; one or more cooling units equipped with a fan and a plurality of second circuit board units, each of which includes a second semiconductor device, are arranged side by side in the chassis on a side of a back side of the chassis than to the relay circuit board; and each first circuit board unit, each second circuit board unit, and each cooling unit are coupled to each other via the relay circuit board and electric power from the power supply unit is supplied via the relay circuit board to each first circuit board unit, each second circuit board unit, and each cooling unit;

wherein a plurality of first upper-side intake holes for introducing intake air to an upper side of the chassis are formed in the upper part of a front face of the chassis, a plurality of first lower-side intake holes for introducing the intake air to a lower part of the front face of the chassis are formed in the lower part of the front face of the chassis, and a first exhaust hole for discharging cooling air discharged from the cooling unit to outside of the chassis is formed in a back face of the chassis;

wherein a second intake hole is formed in a front side of each first circuit board unit;

wherein a plurality of upper-side vent holes for discharging the intake air, which has been introduced through each first upper-side intake hole, to a back side of the chassis, a plurality of lower-side vent holes for discharging the intake air, which has been introduced through each first lower-side intake hole, to the back side of the chassis, and a plurality of openings for introducing the intake air, which has been introduced from each second intake hole to around each first circuit board unit, to the cooling unit are formed in the relay circuit board;

wherein a plurality of first circuit board unit air passages including each second intake hole, a first space part around each first circuit board unit, each opening in the relay circuit board, and a second space part between a back side of the relay circuit board and the cooling unit are formed in the chassis; a plurality of second circuit board unit air passages including each first upper-side intake hole in the relay circuit board, each upper-side vent hole in the relay circuit board, a third space unit between each first upper-side intake hole and each upper-side vent hole, and a fourth space part between the back side of the relay circuit board and the cooling unit are formed; and a plurality of lower-side second circuit board unit air passages including each first lower-side intake hole, each lower-side vent hole in the relay circuit board, a fifth space part between each first lower-side intake hole and each lower-side vent hole, and a sixth space part between a back side of the relay circuit board and the cooling unit are formed;

wherein any of the second circuit board units is placed in each upper-side second circuit board unit air passage or each lower-side second circuit board unit air passage.

11. The network communication device according to claim 10,
wherein an external interface connector, to or from which a cable can be connected or disconnected, is placed on a front side of the first circuit board unit in which the second intake hole is located; and
wherein regarding at least two circuit board units of the circuit board units at which the interface connector is placed, at least one of their widths corresponding to the horizontal direction and their heights corresponding to the vertical direction are different.

12. The network communication device according to claim 10,
wherein an upper-side auxiliary vent hole for introducing the intake air, which has been introduced to the back side of the chassis, to the lower side of the chassis is formed in an upper part of the second circuit board unit in each upper-side second circuit board unit air passage; and a lower-side auxiliary vent hole for introducing the intake air, which has been introduced to the back side of the chassis, to the upper side of the chassis is formed in a lower part of the second circuit board unit in each lower-side second circuit board unit air passage.

13. The network communication device according to claim 12,
wherein in each upper-side second circuit board unit air passage, a plurality of vent holes are formed in each upper-side second circuit board unit in an overlapping area, the second semiconductor device is placed at a position distant from each upper-side second circuit board unit air passage, a heat pipe is mounted on the second semiconductor device via a plate, a radiator fin is placed in each vent hole, and the heat pipe mounted on the second semiconductor device is coupled to each radiator fin;
wherein in each lower-side second circuit board unit air passage, a plurality of vent holes are formed in each lower-side second circuit board unit in an overlapping area, the second semiconductor device is placed at a position distant from each lower-side second circuit board unit air passage, a heat pipe is mounted on the second semiconductor device via a plate, a radiator fin is placed in each vent hole, and the heat pipe mounted on the second semiconductor device is coupled to each radiator fin.

14. A network communication device comprising:
a first circuit board unit where an external interface connector is connectable to and disconnectable from a cable and inserted into a slot is placed on a front face of a chassis;
a relay circuit board coupled to the first circuit board unit inserted into the slot;
a plurality of second circuit board units arranged side by side in a vertical direction in the chassis on a side of a back side of the chassis to the relay circuit board and coupled to the relay circuit board;
one or more cooling units placed between the plurality of second circuit board units and equipped with a fan for externally discharging air from the chassis; and
a third circuit board unit for controlling the first circuit board unit, the second circuit board units, the cooling unit, and a power supply unit via the relay circuit board,
wherein the first circuit board unit and the third circuit board unit are placed above the power supply unit;
wherein a first vent hole is formed in the cooling unit on a side of the relay circuit board and a second vent hole is formed in the cooling unit on a side of the second circuit board unit;
wherein a first front-face vent hole is formed on the front face of the chassis of the first circuit board unit and a second front-face vent hole is formed on the front face of the chassis between the first circuit board unit and the power supply unit.

15. The network communication device according to claim 14,
wherein the relay circuit board is equipped with a circuit on both the front side and back side of the chassis, a plurality of third vent holes passing through the front side and the back side are formed, and the air introduced from the first front-face vent hole and the second front-face vent hole respectively passes through the different third vent holes, wherein the second circuit board unit has a fourth vent hole for introducing the air, which has been introduced from the second front-face vent hole, to the cooling unit, wherein the first front-face vent hole is formed on the front face of the chassis of the first circuit board unit in order to introduce air which is discharged from the cooling unit via the first circuit board unit, the relay circuit board and the first vent hole in accordance with a fan operated by electric power supplied from the power supply unit; and the second front-face vent hole is formed on the front face of the chassis between the first circuit board unit and the power supply unit in order to introduce air which is discharged from the cooling unit to outside the chassis via a space part between the first circuit board unit and the power supply unit, the relay circuit board and the second vent hole in accordance with a fan operated by the electric power supplied from the power supply unit.

* * * * *